(12) United States Patent
Euker

(10) Patent No.: US 6,752,391 B1
(45) Date of Patent: Jun. 22, 2004

(54) CUSTOMIZABLE NEST WITH THE OPTION OF CONVERSION TO A PERMANENT NEST

(75) Inventor: Richard T. Euker, Berthoud, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/511,149

(22) Filed: Feb. 23, 2000

(51) Int. Cl.[7] .................................................. B23Q 3/00
(52) U.S. Cl. ..................... 269/289 R; 269/903; 269/303
(58) Field of Search ......................... 269/254 R, 289 R, 269/303, 306, 290, 903, 909, 900, 313, 314, 309, 291, 305; 156/313, 324

(56) References Cited

U.S. PATENT DOCUMENTS

| | | | | |
|---|---|---|---|---|
| 724,116 | A | * 3/1903 | Maley | 269/303 |
| 2,599,359 | A | * 6/1952 | Banks et al. | 156/313 |
| 2,921,785 | A | * 1/1960 | Underhill | 269/218 |
| 3,020,041 | A | * 2/1962 | Peterson et al. | 269/135 |
| 3,117,045 | A | * 1/1964 | Schwickert | 156/313 |
| 4,186,916 | A | * 2/1980 | Varga | 269/303 |
| 4,630,811 | A | * 12/1986 | Rudisill | 269/118 |
| 4,794,687 | A | * 1/1989 | Peters et al. | 269/900 |
| 4,915,367 | A | * 4/1990 | Carossino | 269/101 |
| 4,939,454 | A | 7/1990 | Miner | 324/158 F |
| 4,961,050 | A | 10/1990 | Harwood et al. | 324/158 F |
| 5,153,505 | A | * 10/1992 | Abita et al. | 324/758 |
| 5,300,881 | A | 4/1994 | Ferrer et al. | 324/158 F |
| 5,305,992 | A | * 4/1994 | Kish | 269/51 |
| 5,321,351 | A | 6/1994 | Swart et al. | 324/158 F |
| 5,408,189 | A | 4/1995 | Swart et al. | 324/758 |
| 5,416,405 | A | 5/1995 | Dill | 324/72.5 |
| 5,436,567 | A | 7/1995 | Wexler et al. | 324/754 |
| 5,492,223 | A | 2/1996 | Boardman et al. | 206/710 |
| 5,506,513 | A | * 4/1996 | Bacher | 324/755 |
| 5,572,144 | A | 11/1996 | Davidson et al. | 324/755 |
| 5,715,167 | A | 2/1998 | Gupta et al. | 364/474.28 |
| 5,788,225 | A | * 8/1998 | Iwata et al. | 269/309 |
| 6,058,592 | A | * 5/2000 | Cadwallader et al. | 29/559 |
| 6,162,336 | A | * 12/2000 | Lee | 204/298.15 |

OTHER PUBLICATIONS

EMC Test Systems, LP, Bench–Top Test Cells 5200 Series, http://www.emctest.com/emchtm/BenchTopTestCells.cfm, 1997, (month unavailable).

* cited by examiner

Primary Examiner—Lee D. Wilson

(57) ABSTRACT

A reconfigurable and customizable nest for a device under test. The reconfigurable nest includes a non-metallic nest plate and nesting blocks. The nesting blocks are positioned around the device under test using removable fastening elements such as double-stick tape. Using the removable fastening elements, the nest may be reconfigured for different devices under test. Once configured, the reconfigurable nest may be converted into a permanent nest by attaching each nesting block to the nest plate using a fastener such as a self-tapping screw.

18 Claims, 11 Drawing Sheets

US 6,752,391 B1

CUSTOMIZABLE NEST WITH THE OPTION OF CONVERSION TO A PERMANENT NEST

REFERENCE TO RELATED APPLICATIONS

The present application is related to the following applications, all of which are incorporated herein by reference as if fully set forth: United States patent application of Russell S. Krajec, entitled "Adjustable Electrical Connector for Test Fixture Nest," and filed Nov. 17, 1999; United States patent application of Russell S. Krajec and Wallace J. Lannen, entitled "Signal Transfer Device for Probe Test Fixture," and filed Nov. 17, 1999; United States patent application of Russell S. Krajec, John L. Bidwell, and William R. Miner, entitled "Customizable Nest for Positioning a Device Under Test," and filed Jan. 18, 2000; United States patent application of Bryan D. Boswell, John L. Bidwell, and Russell S. Krajec, entitled "RF Isolation Test Device Having Ease of Accessibility," and filed on even date herewith; United States patent application of Bryan D. Boswell, John L. Bidwell, and Russell S. Krajec, entitled "RF Isolation Test Device Having a Box Within a Box Configuration for RF Shielding and a Low Resonance Test Environment," and filed on even date herewith; United States patent application of Bryan D. Boswell, John L. Bidwell, and Russell S. Krajec, entitled "RF Isolation Test Device Accommodating Multiple Nest Plates for Testing Different Devices and Providing Variable Testing Options," and filed on even date herewith; United States patent application of Rick T. Euker, entitled "Customizable Nest That Requires No Machining or Tools," and filed on even date herewith; and United States patent application of Rick T. Euker, entitled "Customizable Nest Providing for Adjustable Audio Isolation for Testing Wireless Devices," and filed on even date herewith.

FIELD OF THE INVENTION

The present invention relates to customizing a nest for a device under test.

BACKGROUND OF THE INVENTION

Certain devices are more easily tested and worked on while held securely in position. For example, when performing maintenance on cellular telephones, a person may more easily work with the telephone if it is held securely in position. In addition, holding the device under test in position serves to protect it from potential damage while being worked on. For certain applications, a nest plate may be custom-made for a particular device under test. In order to customize a nest plate, the device under test is measured and appropriate configuration and machining is made of the nest plate to accommodate the device under test, along with a mechanism to hold it in place such as nest pins located in predetermined locations.

Accordingly, a need exists for an improved method of customizing a nest plate and other mechanisms for accommodating a device under test while positioned on a nest plate.

SUMMARY OF THE INVENTION

A customizable nest consistent with the present invention includes a nest plate having a top surface and a bottom surface. A plurality of nesting blocks are attached to the top surface of the nest plate, using a removable fastening element, in order to nest the device under test. Each of the nesting blocks contains an aperture for accommodating a fastener to permanently attach the nesting blocks to the top surface of the nest plate.

A method consistent with the present invention includes providing a nest plate having a top surface and a bottom surface. Using a removable fastening element, a non-metallic nesting block is attached to the top surface of the nest plate at a location used to nest the device under test. Additional nesting blocks are also attached using the removable fastening element as necessary to nest the device. The method also includes permanently attaching each of the nesting blocks to the top surface of the nest plate using a fastener.

BRIEF DESCRIPTION OF THE DRAWINGS

The accompanying drawings are incorporated in and constitute a part of this specification and, together with the drawings, explain the advantages and principles of the invention. In the drawings.

DETAILED DESCRIPTION

Overview

A customizable nest consistent with the present invention provides for the ability to quickly customize a nest for a particular device under test and subsequently reconfigure it for a device having a different shape or configuration. The customizable nest also has various features useful in testing of the device nested. For example, it provides for audio isolation for testing devices having audio features. It further permits that the reconfigurable nest be optionally made into a permanent nest in which the nesting blocks are attached to the nest plate using fasteners. In addition, the customizable nest itself provides the ability of nesting a device under test without requiring use of machining or tools in making the nest.

For example, one type of customizable nest includes a non-metallic nest plate and a plurality of non-metallic nesting blocks. The nesting blocks are attached to the nest plate using a removable toolless fastening element in order to nest the device under test. At least one of the nesting blocks includes an aperture with a detent retainer element permitting toolless installation of a microphone. The nest plate also includes a detent retainer element permitting toolless installation of a speaker.

The nest plate may include a first aperture section and a second aperture section for audio coupling of audio elements such as the installed speaker and microphone with the device under test when nested on the top surface. The first and second aperture sections provide the audio isolation when the device under test is nested on the top surface. The first aperture section can accommodate the nesting block with the installed microphone, and the second aperture section can accommodate the installed speaker.

The customizable nest may also include an option of conversion to the permanent nest. For the permanent nest, each of the nesting blocks contains an aperture for accommodating a fastener to permanently attach the nesting blocks to the top surface of the nest plate.

The customizable nest may be used to nest various types fo devices under test, particularly wireless devices. Examples include cellular telephones, satellite telephones, pagers, and Internet appliances. The nesting provides a stable test environment when, for example, the customized nest is placed within a test device having RF shielding. It can thus be used with any device having wireless RF test needs or audio test requirements.

Customizable Nest and Nest Plate

Figure 1:
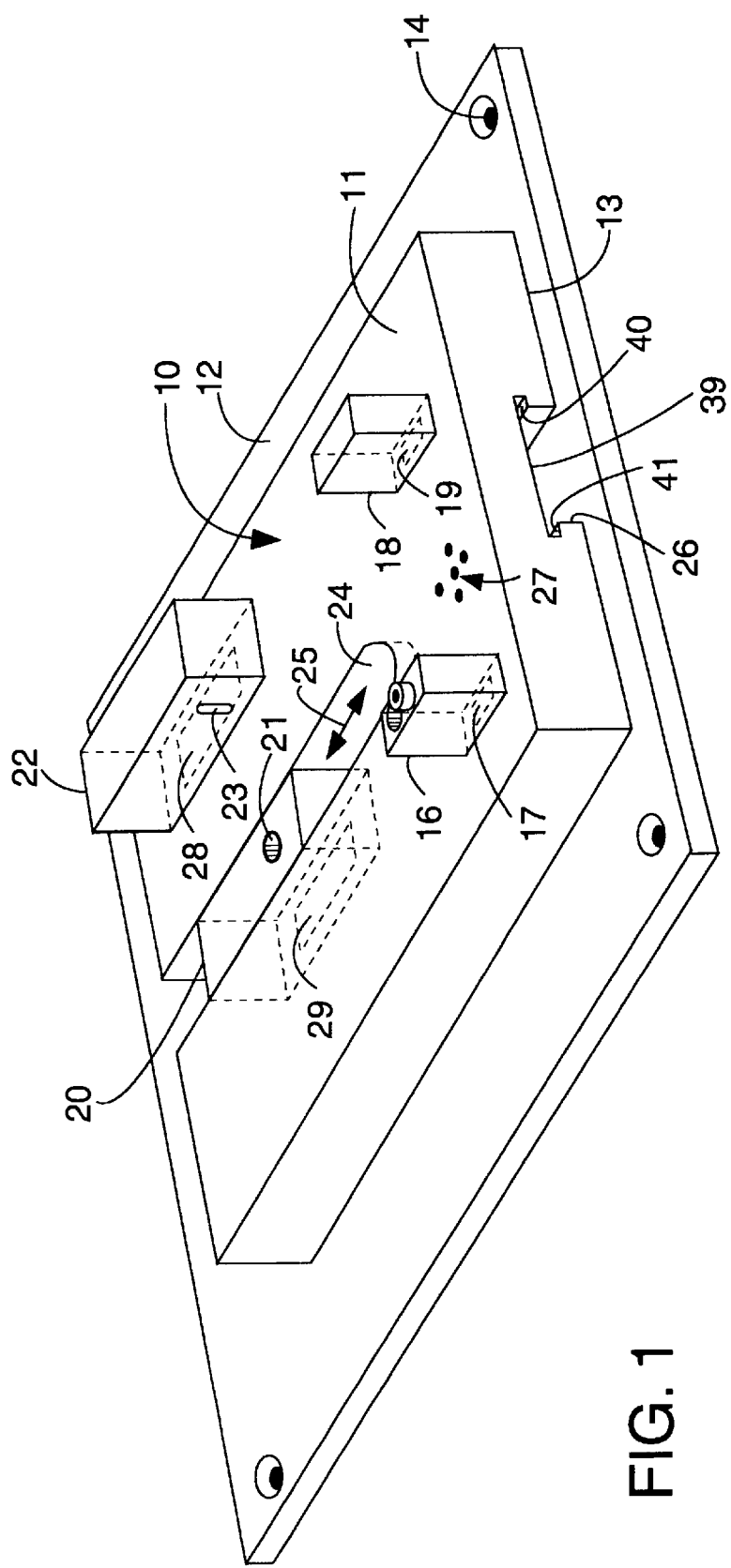
FIG. 1 is a perspective diagram of a customizable nest.
Figure 2:
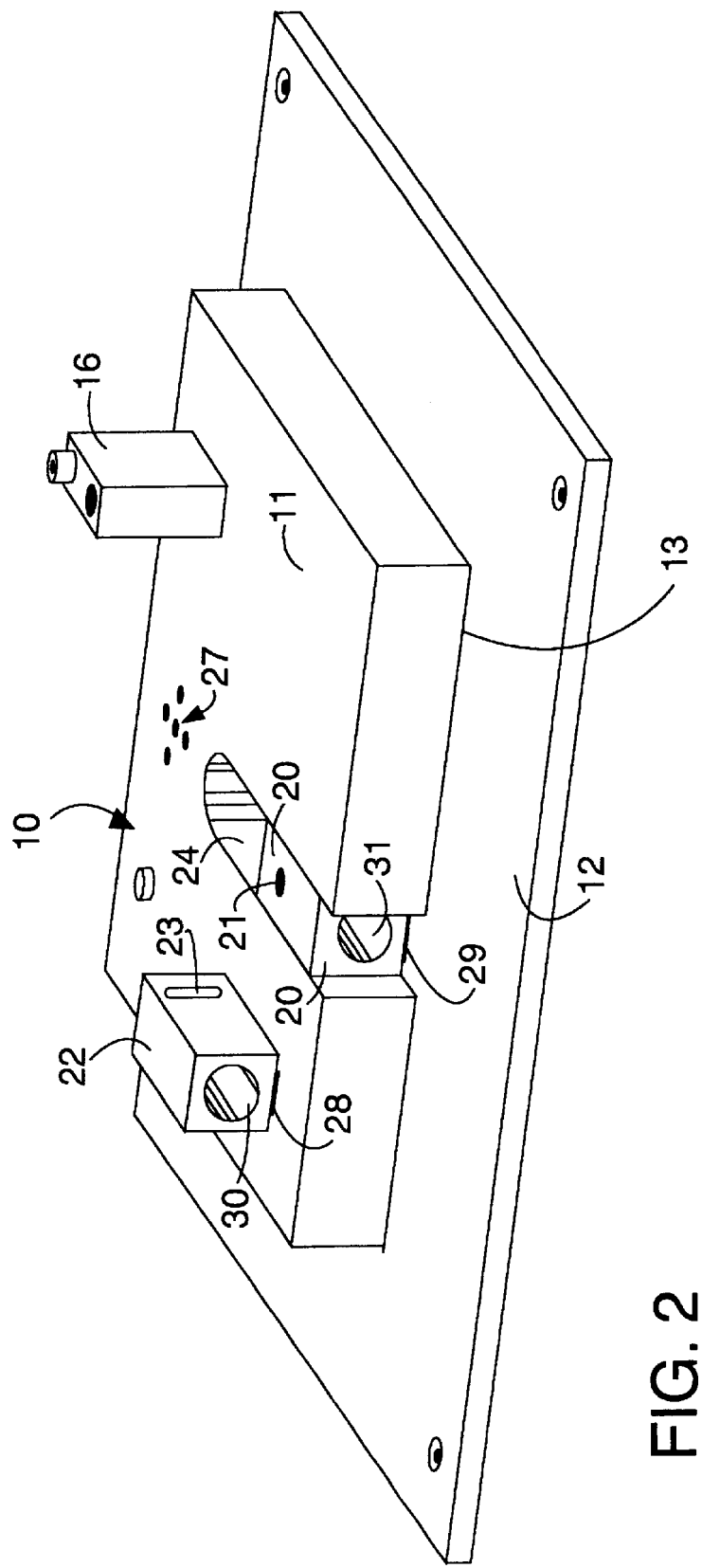
FIG. 2 is a perspective diagram of the customizable nest taken from the opposite view shown in FIG. 1.

FIG. 1 is a diagram of a perspective view of a customizable nest. FIG. 2 is a perspective view of the customizable nest as shown in FIG. 1 taken from an opposite angle. As shown in FIGS. 1 and 2, the customizable nest includes a nest plate 10 on a base plate 12. Base plate 12 includes a plurality of apertures, such as aperture 14, for fastening base plate 12 to, for example, an enclosure for providing radio frequency (RF) isolation and shielding in testing a device nested on nest plate 10. Examples of such enclosures are described in the related applications identified above. Nest plate 10 may be fastened onto base plate 12 using, for example, an adhesive type material such as double-stick tape. A device under test is nested on nest plate 10, as further explained below.

Nest plate 10 includes a top surface 11, on which is placed a device under test, and a bottom surface 13 for placement against base plate 12. The device under test is nested using nesting blocks such as nesting blocks 16 and 18 on top surface 11. Nesting blocks 16 and 18 illustrate two different types of nesting blocks, which are used to nest a device under test. Nesting block 16, as further explained below, includes the ability to make the customizable nest into a permanent nest. In comparison, nesting block 18 is shown for use only with a reconfigurable nest.

In providing a reconfigurable nest, nesting blocks 16 and 18 are attached to top surface 11 using, respectively, removable fastening elements 17 and 19. By using a removable fastening element, nesting block 16 and 18 may be positioned and subsequently repositioned on top surface 11 for use in nesting different shaped devices. Although the nest plate and nesting blocks are shown having a rectangular shape, they may be implemented with various other shapes; for example, the nesting blocks may have an oval or round cross-sectional shape.

In this example, removable fastening elements 17 and 19 are implemented with a double-stick tape material. This tape has an adhesive material on both sides for attachment to nesting block 16 or 18 and also attachment to top surface 11. The adhesive material provides that the nesting block is firmly attached to top surface 11, but yet may still be removed and fastened to another location on top surface 11. The fastening elements are also toolless in this example in that they do not require tools for attachment to the nest plate and nesting blocks. The term "removable toolless fastening element" includes any material or element permitting fastening and repositioning of nesting blocks without requiring use of tools.

Nest plate 10 also includes structures for audio coupling of a device under test to testing apparatus. For example, it includes a speaker aperture 26 including ridges 40 and 41 for accommodating a speaker. Sound from the speaker may traverse nest plate 10 through apertures 27 and thus audio couple with a device under test nested on nest plate 10. The speaker is used to audio couple with a microphone within the device under test, such as a cellular telephone. The speaker aperture may be implemented with various shapes depending upon, for example, the shape of a speaker it is intended to accommodate.

The customizable nest also includes one or more microphone blocks 20 and 22 for audio coupling with speakers in the device under test. A microphone block 20 may receive a microphone and includes an aperture 21 for receiving sound produced from a speaker or other sound generating device and permitting the sound to be received by the microphone. The other microphone block 22 also includes an aperture 23 for likewise receiving sound and passing the sound to a microphone located within microphone block 22. Microphone blocks may optionally be used as nesting blocks.

The position of microphone block 20 may be adjusted by sliding it within an adjustment section 24 as shown by arrows 25. Therefore, adjustment section 24 includes a cut-out section within nest plate 10 having a width approximately equal to the width of microphone block 20. Microphone block 20 may be attached to base plate 12 using a removable fastening element 29 such as double-stick tape. Microphone block 22 may likewise be positioned using a removable fastening element 28 and can be positioned on top surface 11 of nest plate 10. In use, the two microphone blocks 20 and 22 may receive sound from, respectively, a speaker and ringer of a cellular telephone nested on nest plate 10. Other types or configurations of audio elements may also be used.

FIG. 2 further illustrates the apertures within microphone blocks 20 and 22 for accommodating microphones. In particular, FIG. 2 is a perspective view taken from an opposite angle compared with the view shown in FIG. 1. Microphone block 20 includes an aperture 31 connected with aperture 21 for accommodating a microphone. Microphone block 22 includes an aperture 30 connected with aperture 23 for accommodating another microphone. These apertures 30 and 31 may thus receive a cylindrical microphone having a diameter approximately equal to or less than the diameter of apertures 30 and 31.

Figure 3:
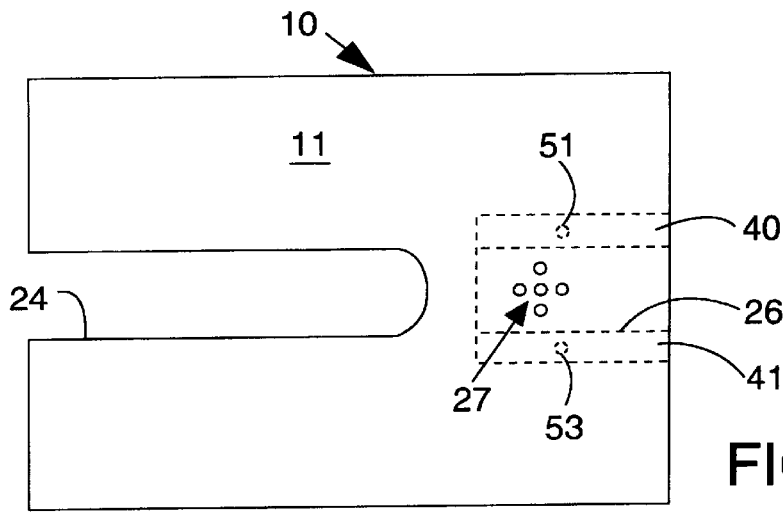
FIG. 3 is a top view of a nest plate for the customizable nest.
Figure 4:
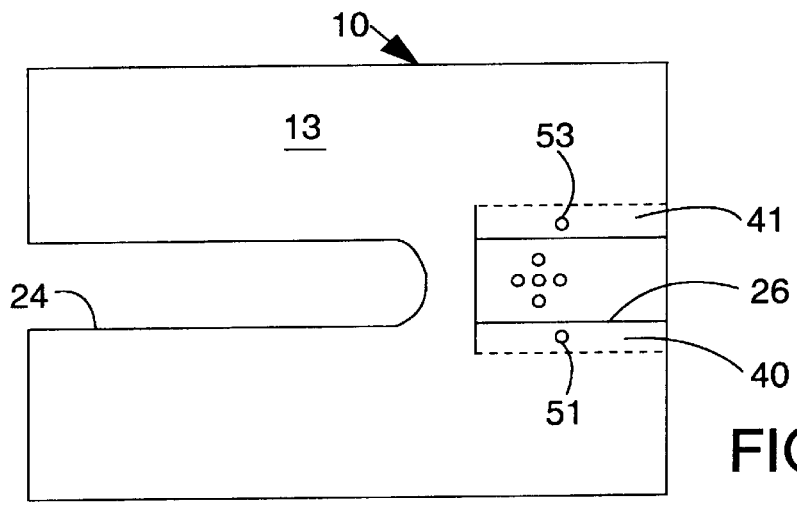
FIG. 4 is a bottom view of the nest plate.
Figure 5:
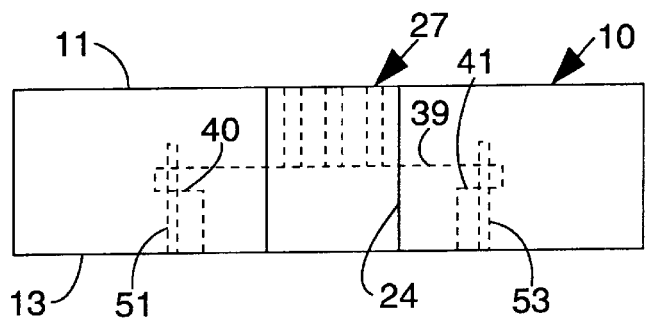
FIG. 5 is an end view of the nest plate.
Figure 6:
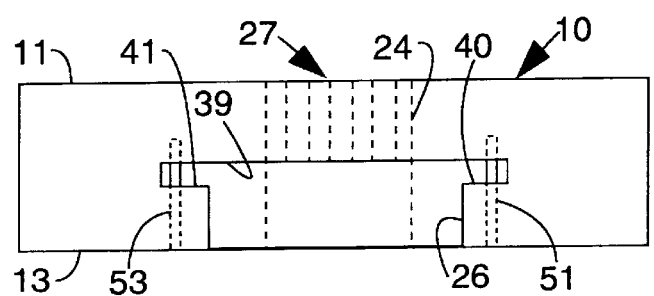
FIG. 6 is an opposite end view of the nest plate in comparison with the end view shown in FIG. 5.

The exemplary configuration of nest plate 10 is further illustrated in FIGS. 3–6. In particular, FIGS. 3 and 4 are top and bottom views, respectively, of nest plate 10. FIGS. 5 and 6 are end views taken from opposite ends of nest plate 10. FIGS. 3–6 also illustrate detent retainer elements 51 and 53, implemented in this example with flexible cylindrical rods, in speaker aperture 26. Detent retainer elements 51 and 53 are pressed in from bottom surface 13 during manufacture of nest plate 10, and they permit toolless installation of a speaker in speaker aperture 26 and secure the speaker within it. Nest plate 10 may include only one detent retainer element in speaker aperture 26 as opposed to multiple as shown.

Figure 7:
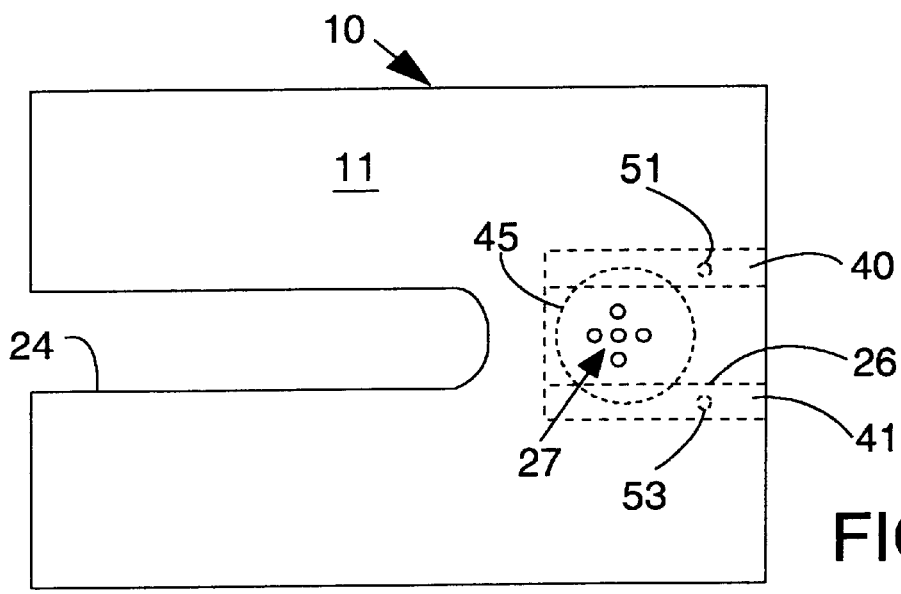
FIG. 7 is a top view of the nest plate illustrating an installed speaker.
Figure 8:
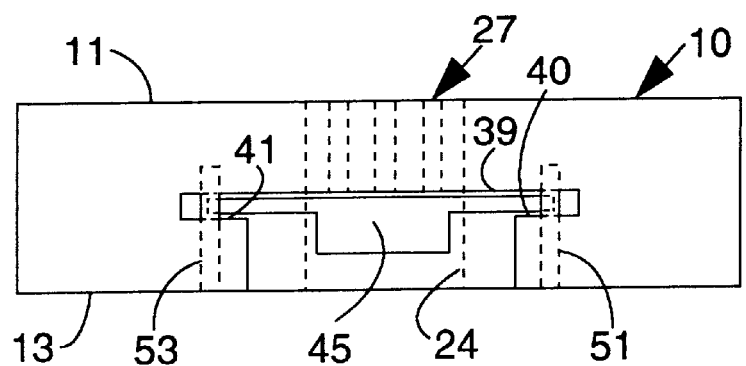
FIG. 8 is an end view of the nest plate illustrating the installed speaker.
Figure 9:
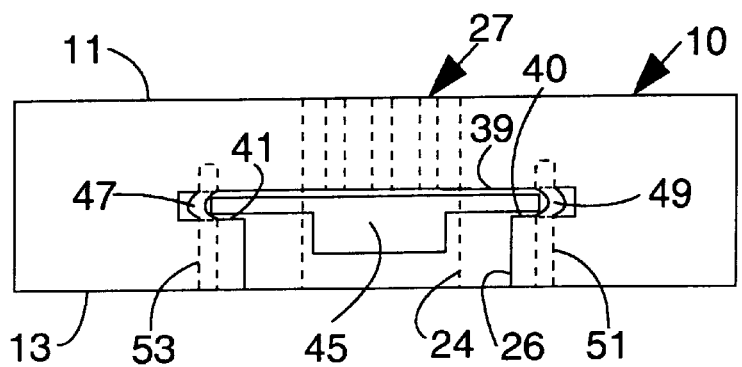
FIG. 9 is an end view of the nest plate illustrating installation of the speaker past detent retainer elements.
Figure 10:
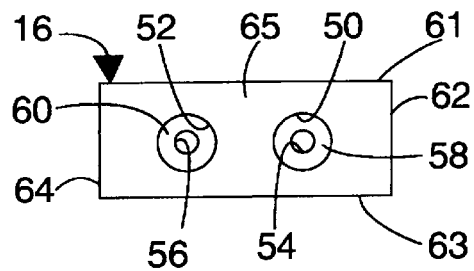
FIG. 10 is a top view of a nesting block.
Figure 11:
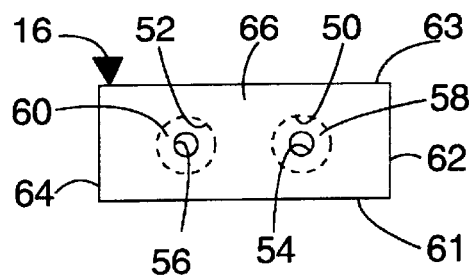
FIG. 11 is a bottom view of the nesting block.

In particular, FIGS. 7–9 further illustrate use of detent retainer elements 51 and 53. FIGS. 7 and 8 are, respectively, top and end views of nest plate 10 illustrating an installed speaker 45. When installed, detent retainer elements 51 and 53 securely hold speaker 45 in position on ridges 40 and 41. FIG. 9 is an end view of nest plate 10 illustrating installation of speaker 45 past detent retainer elements 51 and 53. During installation of speaker 45, detent retainer elements 51 and 53 flex outward, as shown by flexed portions 47 and 49, to allow speaker 45 to "snap into" speaker aperture 26. Detent retainer elements 51 and 53 then return to a straight configuration after installation, as shown in FIG. 8, to hold speaker 45 in place. They may also flex outward to permit removal of speaker 45. Therefore, detent retainer elements 51 and 53 permit toolless installation and locking of a speaker in speaker aperture 26. Although detent retainer elements 51 and 53 are shown as cylindrical rods, they may be implemented with other cross-sectional shapes such as oval, triangular, or rectangular.

Nest plate 10, nesting blocks 16 and 18, and microphone blocks 20 and 22 are all in this example composed of a non-metallic material; for example, a non-marring polymer material such as an acetal resin product. Base plate 12 may be formed from a metallic or non-metallic material for mounting within a test device providing RF shielding, :such as those described in the related applications identified above.

Nesting Block

FIGS. 10–13 are different views illustrating an exemplary configuration of nesting block 16. In particular, FIGS. 10, 11, 12, and 13 are top, bottom, front, and side views, respectively, of nesting block 16. As shown in FIGS. 10–13, nesting block 16 in this example includes a rectangular cross-sectional configuration having sides 61, 62, 63, and 64. It has a top surface 65, and a bottom surface 66 for placement against top surface 11 of nest plate 10.

Nesting block 16 in this example includes the ability to make the nesting block part of a permanent nest. It includes, in particular, a pair of apertures for accommodating a pair of fasteners to attach nesting block 16 to nest plate 10. One aperture includes a first aperture 50 along with a second aperture 54 having a narrower diameter providing for a ridge 58. The other aperture includes a first aperture 52 along with a second aperture 56 having a smaller diameter providing for a ridge 60.

Nesting block 16 may be permanently attached to nest plate 10 through use of these apertures along with a removable metal bushing 70. Bushing 70 includes an aperture 71 having approximately the same diameter as apertures 54 and 56. In use, once nesting block 16 is placed in position for nesting such as through use of the removable fastening element, bushing 70 is placed in one of the apertures 50 or 52. A user then drills a hole in top surface 11 of nest plate 10 using aperture 71 in bushing 70 as a guide. In particular, a drill bit may be used having a diameter slightly less than the diameter of apertures 71 and 54 in order to guide the drill bit through aperture 54. After drilling a hole in top surface 11, the user removes bushing 70 and inserts a fastener into aperture 54. This fastener may be implemented with, for example, a self-tapping screw 67; various other types of fasteners may alternatively be used. Screw 67 includes a point 68 and head 69. In use, point 68 is attached to nest plate 10 with head 69 applying sufficient downward force on ridge 60 to hold nesting block 16 in position. Another fastener may be installed in the other aperture of the nesting block in a similar manner.

When in use, one of the longer side surfaces 61 or 63 is typically used for nesting a device under test by contacting or closely contacting the device. Alternatively, one of the short ends 62 or 64 may be used. Also, although two apertures are shown for receiving two fasteners to make nesting block 16 permanent, more or fewer apertures may be used. However, the use of at least two apertures to accommodate two fasteners further limits rotational movement of nesting block 16 in comparison if only one fastener were used. In addition, the nesting block may alternatively include the apertures for permanent attachment on any of its sides 61, 62, 63, 64, 65, or 66 depending upon a desired orientation of the nesting block on the nest plate.

If a user does not require the option of having a nesting block with the capability to be permanently attached, nesting block 18 may be used instead. Nesting block 18 may be implemented with the same configuration as nesting block 16 with the exception that it need not include the two apertures.

Microphone Block

Figure 14:
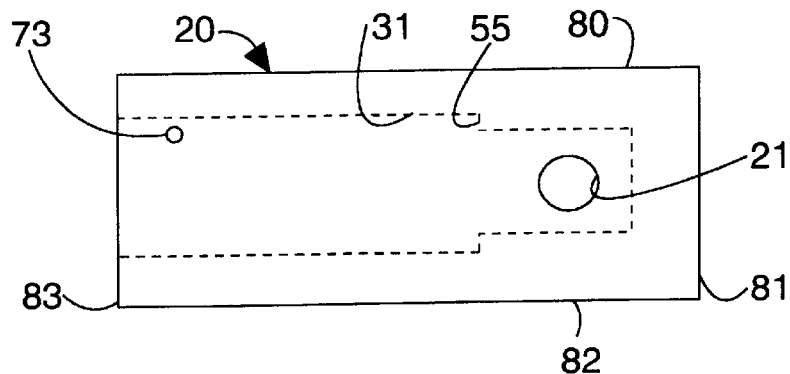
FIG. 14 is a side view of a microphone block.
Figure 15:
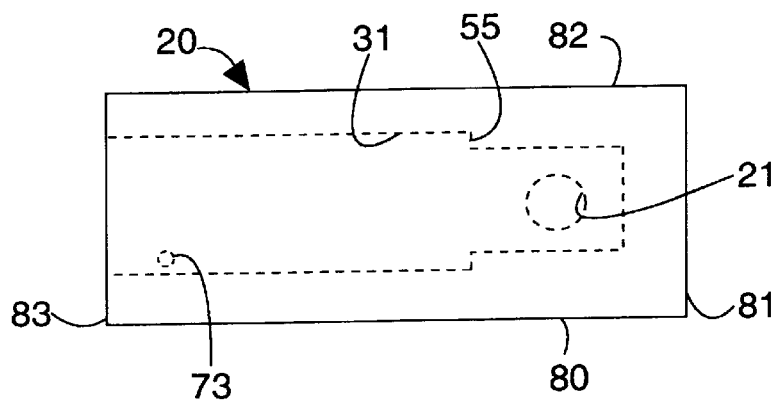
FIG. 15 is an opposite side view of the microphone block in comparison with the side view shown in FIG. 14.
Figure 16:
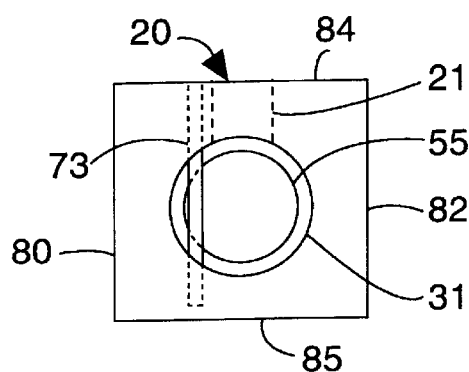
FIG. 16 is an end view of the microphone block.
Figure 17:
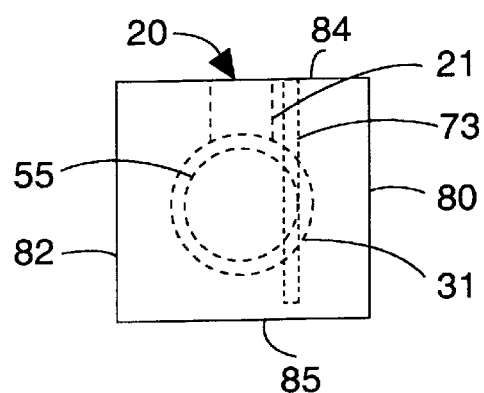
FIG. 17 is an opposite end view of the microphone block in comparison with the end view shown in FIG. 16.

FIGS. 14–17 are various views providing more detail of microphone block 20. FIGS. 14 and 15 are side views, and FIGS. 16 and 17 are end views, of an exemplary configuration of microphone block 20. As indicated above, microphone block 20 includes an aperture 31 for use in accommodating a microphone. Aperture 31 is connected to an aperture 21, which provides for passage of sound into aperture 31 for being received by the microphone when in use. Aperture 31 in this example includes a ridge 55 used as a stop for an installed microphone, and it also includes a detent retainer element 73, implemented in this example with a flexible cylindrical rod, in aperture 31. Detent retainer element 73 is pressed in from surface 84 during manufacture of microphone block 20, and it helps to secure a microphone in aperture 31. The microphone blocks may include multiple detent retainer elements as opposed to one as shown.

Figure 18:
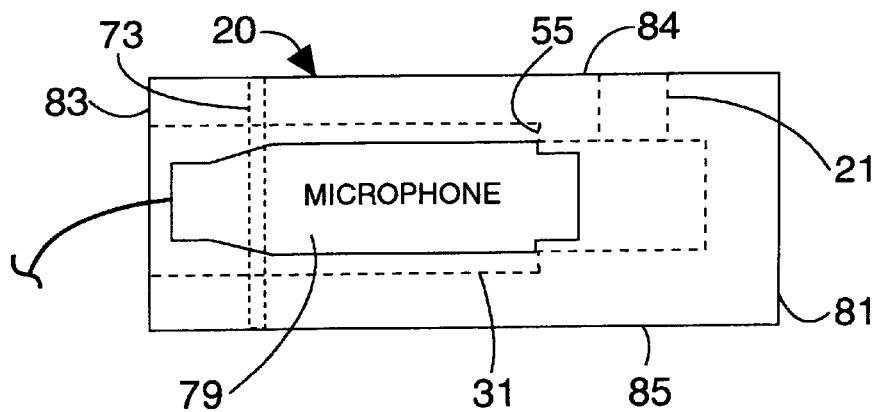
FIG. 18 is a side view of the microphone block illustrating an installed microphone.
Figure 19:
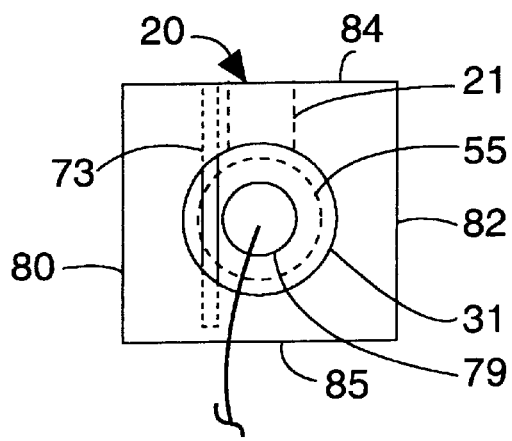
FIG. 19 is an end view of the microphone block illustrating the installed microphone.
Figure 20:
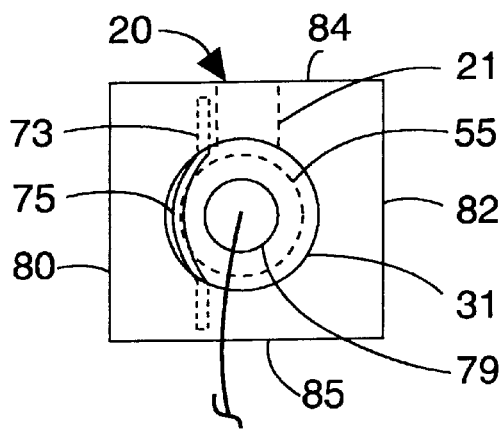
FIG. 20 is an end view of the microphone block illustrating installation of the microphone past a detent retainer element.

In particular, FIGS. 18–20 further illustrate use of detent retainer element 73. FIGS. 18 and 19 are, respectively, side and end views of microphone block 20 illustrating an installed microphone 79. When installed, detent retainer element 73 securely holds microphone 79 in position against ridge 55. FIG. 20 is an end view of microphone block 20 illustrating installation of microphone 79 past detent retainer element 73. During installation of microphone 79, detent retainer element 73 flexes outward, as shown by flexed portion 75, to allow microphone 79 to "snap into" aperture 31. Detent retainer element 73 then returns to a straight configuration after installation, as shown in FIG. 19, to hold microphone 79 in place. It may also flex outward to permit removal of microphone 79. Therefore, detent retainer element 73 permits toolless installation and locking of a microphone in aperture 31. Although detent retainer element 73 is shown as a cylindrical rod, it may be implemented with other cross-sectional shapes such as oval, triangular, or rectangular.

In this example as well, microphone block 20 includes a rectangular configuration, as shown in one side view, having sides 80, 81, 82, and 83. It also includes in this example a square cross-sectional shape, as shown in the end view, having sides 80, 82, 84 and 85. Aperture 21 may include various configurations. For example, as shown with microphone block 20, aperture 21 includes a circular cross-sectional shape. Alternatively, as shown in FIGS. 1 and 2 microphone block 22 may include an oval or elongated aperture 23, which corresponds with aperture 21. The configuration of this aperture for transmitting sound into aperture 31 may depend upon a source of the sound and a configuration providing the best sound passage. Microphone block 22 may otherwise have the same configuration as microphone block 20. In addition, aperture 31 may have various configurations depending upon a microphone it is intended to accommodate.

Use of Customizable Nest

Figure 21:
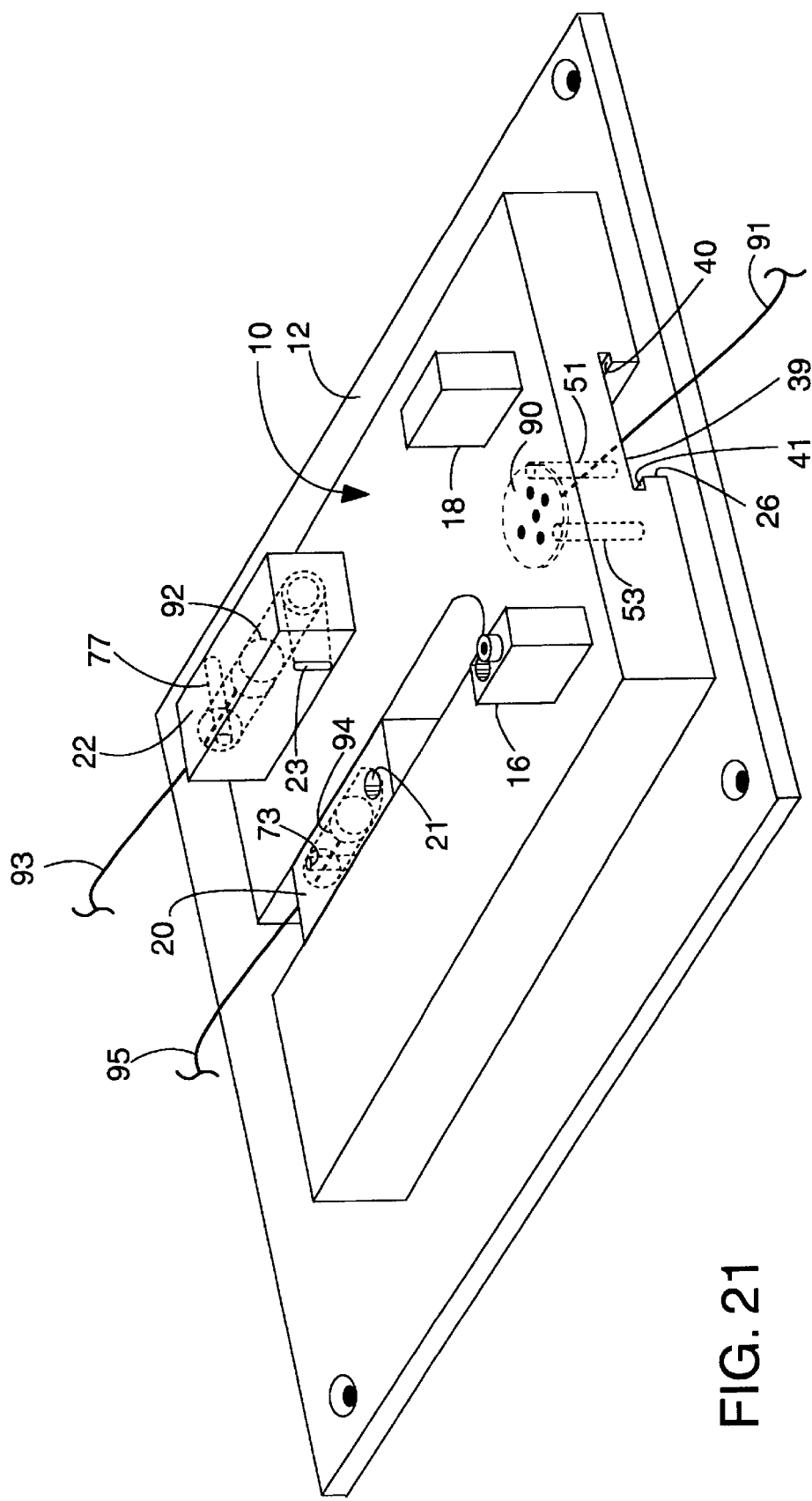
FIG. 21 is a perspective diagram of the customizable nest illustrating installation of microphone(s) and a speaker for use in testing a device under test.

FIG. 21 is a perspective view illustrating placement of a speaker and microphones within the customizable nest. A speaker 90, as shown, is positioned within speaker aperture 26. In this example, speaker 90 is held into position by having edges that fit on ridges 40 and 41, and having a configuration held in place by detent retainer elements 51 and 53, as described above, when speaker 90 is snapped into place. Speaker 90 is thus held in position through placement between upper surface 39 of speaker aperture 26, ridges 40 and 41, and detent retainer elements 51 and 53. Speaker 90 also includes a line 91 for electrical connection with testing apparatus.

FIG. 21 also illustrates placement of microphones within microphone blocks 20 and 22. In particular, microphone block 20 includes a microphone 94 for placement within aperture 31 in microphone block 20. Microphone block 22 includes a microphone 92 for placement in aperture 30. Microphones 92 and 94 also include lines 93 and 95, respectively, for electrical connection with testing apparatus. Microphones 92 and 94 are shown conceptually in phantom and may have the same configuration as microphone 79 shown in FIGS. 18–20. Therefore, detent retainer element 73 in microphone block 20 and a similar a detent retainer element 77 microphone block 22 permit toolless installation of microphones 92 and 94 when snapped into place as described above and lock them in place when installed.

With the microphones and speaker in place, a device such as a cellular telephone may be tested. In particular, speaker 90 provides sound for being received by a microphone in a mouthpiece of the cellular telephone. Microphone 94 receives sound from a speaker in the earpiece of the cellular telephone. Microphone 92 receives sound from a ringer in the cellular telephone.

Figure 22:
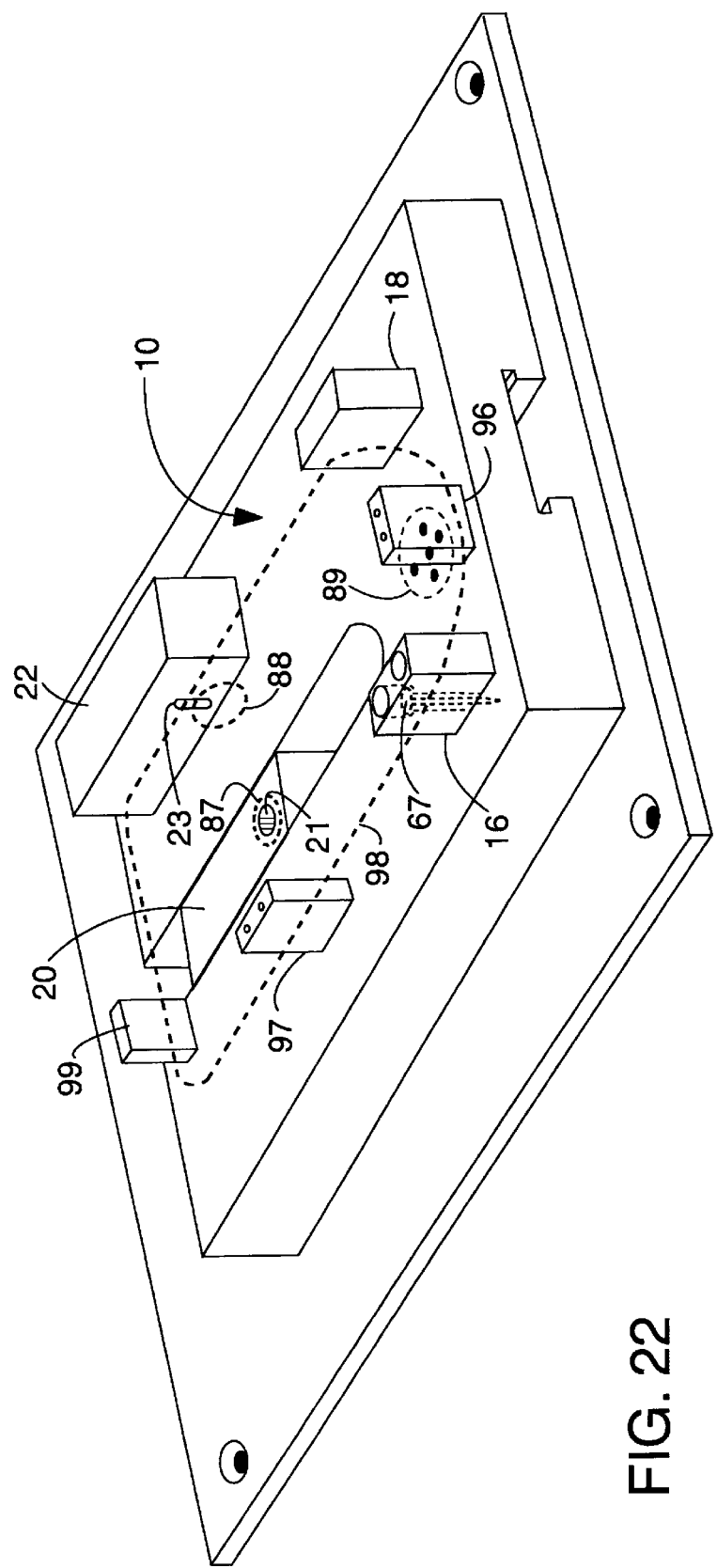
FIG. 22 is a perspective diagram of a device nested using the customizable nest.

This audio coupling is further illustrated in FIG. 22, showing a device under test 98 nested by several nesting blocks. Microphones and speaker are not shown in FIG. 22 for simplicity of illustration; in operation, microphones and a speaker would be installed as shown in FIG. 21. As shown in FIG. 22, device under test 98 is nested by nesting blocks 16, 18, 96, 97, and 99. In addition, microphone block 22 may provide for additional nesting on a corresponding side of device under test 98. These nesting blocks hold device under test 98 in position by contacting or closely contacting it on sufficient number of sides.

FIG. 22 also illustrates audio coupling of device under test 98 with the speakers and microphone when device under test 98 is nested face down on nest plate 10. In particular, element 89 represents a microphone in a mouthpiece in device under test 98 such as a cellular telephone for receiving sound from speaker 90 when positioned as shown in FIG. 21. Likewise, element 87 represents a speaker within an earpiece of device under test 98, and element 88 represents a ringer in device under test 98. Sound from earpiece 87 is audio coupled to microphone 94, and sound from ringer 88 is audio coupled microphone 92, when those microphones are positioned as shown in FIG. 21. Microphone block 20 may be adjusted by moving it as shown by arrows 25 (see FIG. 1) in order to line up microphone 94 through aperture 21 with the speaker in the device under test or other sound generating device.

In addition, FIG. 22 illustrates use of fastener 67 to permanently attach nesting block 16 to nest plate 10, as described above. Additional fasteners would also be used in the other apertures of the nesting blocks for the permanent attachment.

FIGS. 23–26 further illustrate use of a nesting block 100 for nesting of irregularly-shaped (non-rectilinear) objects or devices under test. Nesting block 100 may have the same configuration and material as nesting blocks 16 or 18 described above. Irregularly-shaped objects often present various types of configurations and surfaces requiring nesting, and nesting block 100 can accommodate those configurations and surfaces. Nesting block 100 can be secured on nest plate 10 using the removable fastening element, or permanent fastener, described above for nesting of these objects.

Figure 23:
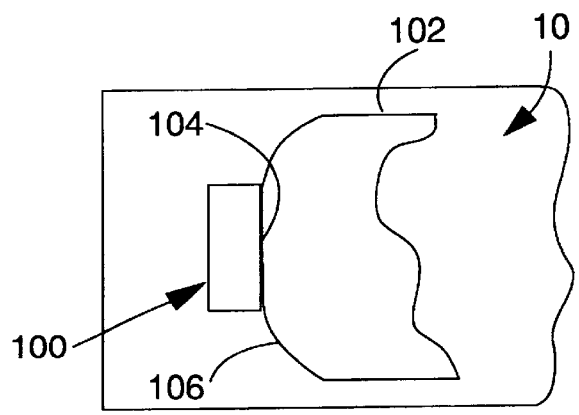
FIG. 23 is a top view illustrating use of the nesting block to nest a wide portion of an object.
Figure 24:
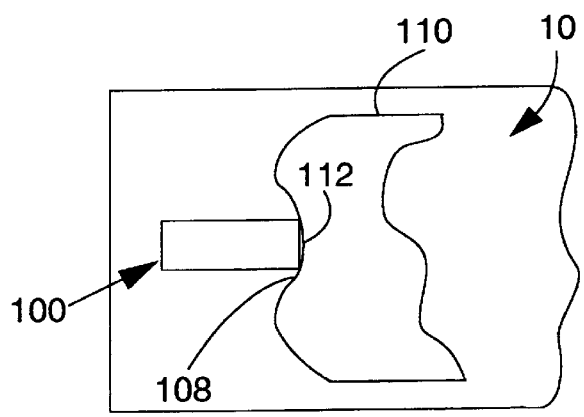
FIG. 24 is a top view illustrating use of the nesting block to nest a narrow portion of an object.
Figure 25:
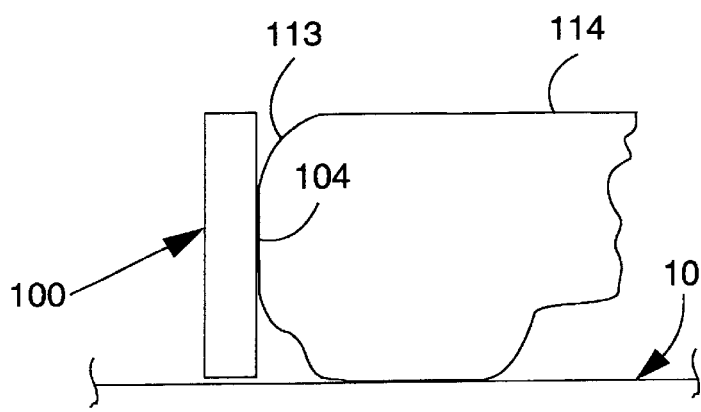
FIG. 25 is a side view illustrating use of the nesting block to nest a high portion of an object.
Figure 26:
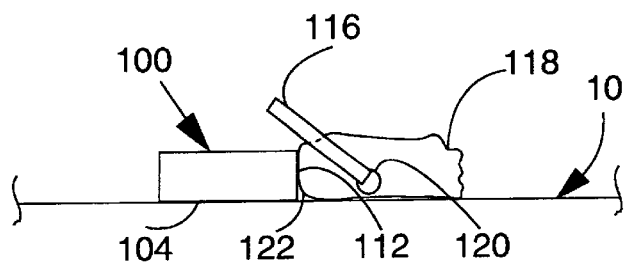
FIG. 26 is a side view illustrating use of the nesting block to nest a low portion of an object.

FIG. 23 is a top view illustrating use of nesting block 100 to nest a wide portion 106 of an object 102 on nest plate 10. A long side 104 of nesting block 100 can accommodate wide portion 106 for the nesting. FIG. 24 is a top view illustrating use of nesting block 100 to nest a narrow portion 108 of an object 110. A short side 112 of nesting block 100 is used to accommodate narrow portion 108 for the nesting. FIG. 25 is a side view illustrating use of nesting block 100 to nest a high portion 113 of an object 114. Long side 104 can accommodate high portion 113 for the nesting. Finally, FIG. 26 is a side view illustrating use of nesting block 100 to nest a low portion 122 of an object 118. By securing it on long side 104, short side 112 of nesting block 100 can accommodate low portion 122 and still allow for movement of a "flip" portion 116 that pivots about point 120.

Accordingly, as illustrated in FIGS. 23–26, a customized nest using nesting block 100 or others described above permits the nest to precisely hold irregularly shaped objects for test purposes. An example of one such object is a cellular telephone, and other examples include other types of wireless devices. To make the customized nest, the nesting blocks are typically placed at adjacent and opposite sides of a device under test, where needed based upon its shape, to precisely hold the device. The shape of the nesting blocks, such as the rectangular shape shown in FIGS. 23–26, provides support for wide, narrow, high, and low objects or devices depending upon how the nesting blocks are positioned and the type or orientation of nesting required.

Figure 27:
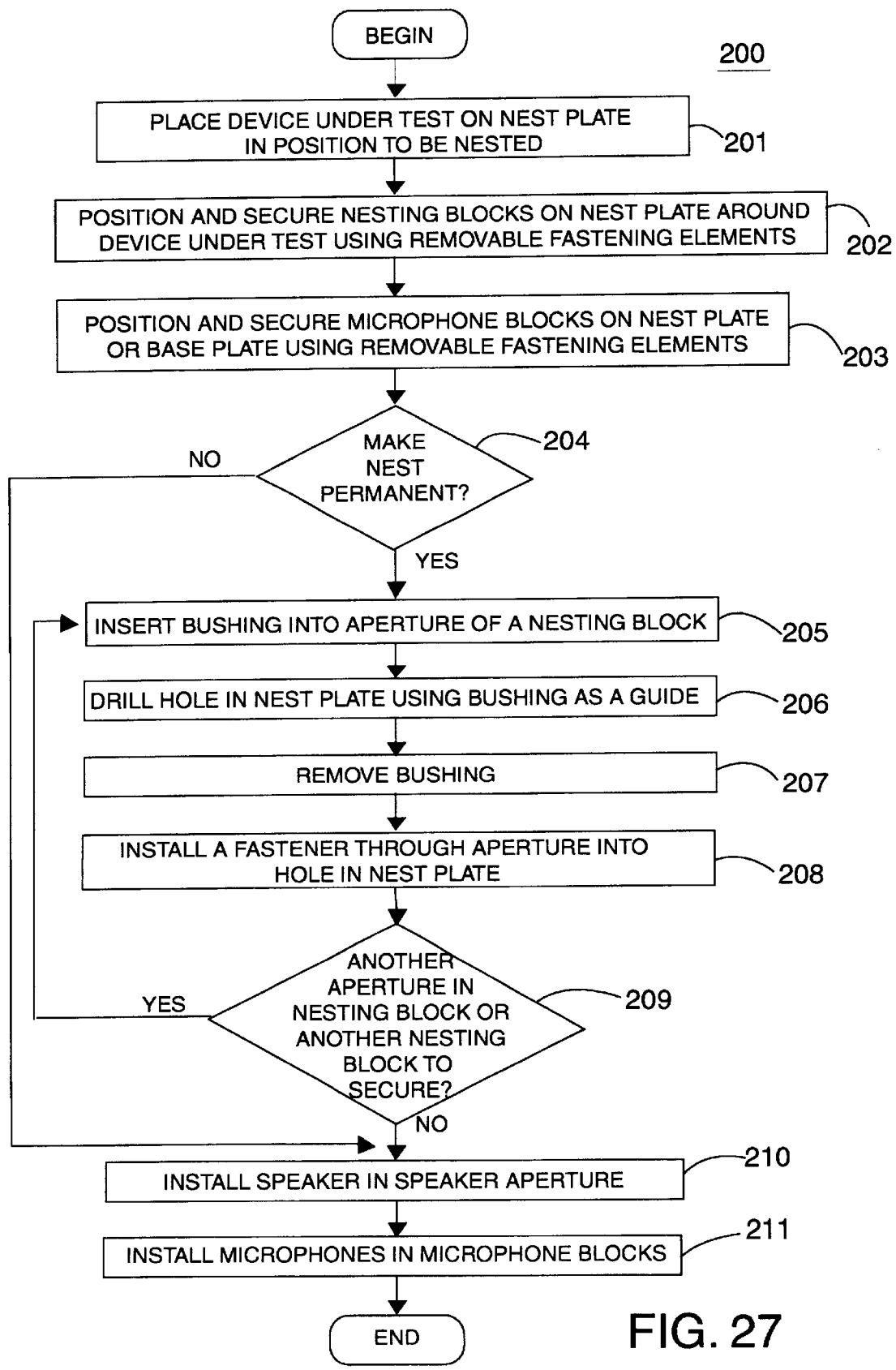
FIG. 27 is a flow chart of a method for customizing a nest for a device under test and for alternatively making the customized nest a permanent nest.

FIG. 27 is a flow chart of a method 200 for customizing a nest for a device under test and for alternatively making the customized nest a permanent nest. In method 200, a user first places the device under test on nest plate 10 in a position to be nested (step 201). Nesting blocks, such as nesting blocks 16 and 18, are then positioned and secured around the device under test using the removable fastening elements (step 202). A sufficient number of nesting blocks is used to securely hold the device under test in position. The nesting may occur through any type of placement of the nesting blocks, and examples are provided in FIGS. 23–26. The microphone blocks are also positioned and secured on nest plate 10 or base plate 12 using the removable fastening elements (step 203). Steps 102 and 103 may be performed in any order. For example, user may first position the microphone blocks and then position the nesting blocks for nesting the device under test.

Figure 12:
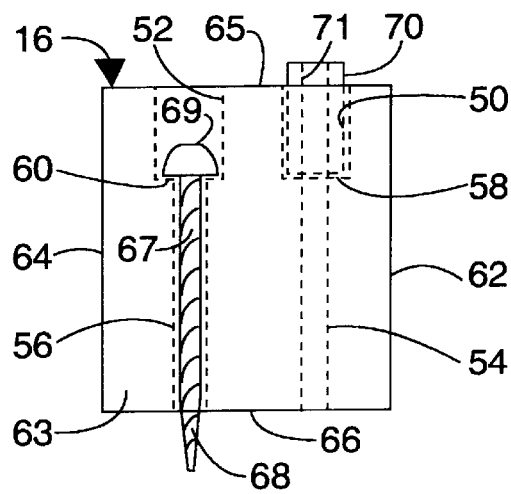
FIG. 12 is a front view of the nesting block.
Figure 13:
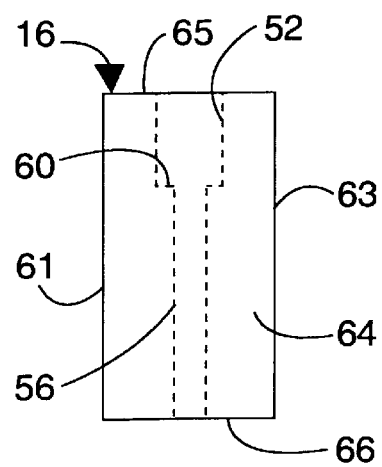
FIG. 13 is a side view of the nesting block.

A user may also have the option of making the reconfigurable nest a permanent nest (step 204). To make the nest permanent, the user selectively attaches the nesting blocks to nest plate 10 after being positioned for nesting the device under test. For attaching the nesting blocks, bushing 70 is positioned into an aperture of a nesting block (step 205), and a hole is drilled in nest plate 10 using bushing 70 as a guide (step 206). Bushing 70 is removed (step 207), and a fastener is installed into the hole in nest plate 10 through the aperture (step 208). This fastening is illustrated in FIGS. 12 and 22. If another aperture exists in the nesting block to accommodate a fastener or if another nesting block exists to be secured (step 209), the user repeats steps 205–208.

After nesting the device under test, the user may install a speaker in speaker aperture 26 (step 210), and install microphone(s) in microphone blocks 20 and 22 (step 211), in order to complete the configuration for testing of the device under test. The installation of the speaker and microphone(s) may occur through toolless locking of the speaker and microphone(s) using the detent retainer elements in the speaker aperture and microphone blocks as explained above. More or fewer microphone blocks with installed microphones may be used depending upon a particular type of testing.

Accordingly, the customizable nest provides for quick assembly as it needs no machining or even tools when a toolless removable fastening element is used. Devices can be quickly tested within, for example, a design environment, which avoids undesirable delays from configuration of a nest for testing that may otherwise require custom machining and fabrication. A speaker and microphone(s) can be quickly installed through the toolless installation. Also, once configured, many of the same type of device can be quickly placed within the nest and tested without requiring reconfiguration. In addition, multiple nests can be configured for different types of devices and then quickly interchanged within a test device providing RF shielding.

While the present invention has been described in connection with an exemplary embodiment, it will be understood that many modifications will be readily apparent to those skilled in the art, and this application is intended to cover any adaptations or variations thereof. For example, different shapes and configurations of the nest plate and nesting blocks, and various types of materials for them, may be used without departing from the scope of the invention. This invention should be limited only by the claims and equivalents thereof.

What is claimed is:

1. A customizable nest for a device under test, comprising:
   a nest plate having a top surface and a bottom surface; and
   a plurality of nesting blocks for attachment to any desired locations, not restricted to predetermined locations, on the top surface of the nest plate in order to nest the device under test, the nesting blocks being attached using a removable fastening element,
   wherein each of the nesting blocks contains an aperture for accommodating a fastener to permanently attach the nesting blocks to the top surface of the nest plate.

2. The customizable nest of claim 1 wherein the removable fastening element includes double-stick tape.

3. The customizable nest of claim 1 wherein the nest plate and the nesting blocks are composed of a polymer material.

4. The customizable nest of claim 1 wherein the nesting blocks have a rectangular cross-sectional shape.

5. The customizable nest of claim 4, wherein the rectangular nesting block is capable of attachment to the nest plate on any side of the rectangular nesting block.

6. The customizable nest of claim 1 wherein the nest plate includes an aperture for access to a portion of the device under test when placed against the top surface.

7. The customizable nest of claim 1 wherein the aperture in the nesting block is configured to accommodate a bushing for drilling a hole in the top surface.

8. The customizable nest of claim 1 wherein the aperture in the nesting block includes first and second apertures, having different diameters, joined to form a ridge.

9. The customizable nest of claim 1 wherein the nest plate includes a speaker aperture for accommodating a speaker.

10. The customizable nest of claim 1, further including a base plate fastened to the bottom surface of the nest plate using the removable fastening element.

11. The customizable nest of claim 1, wherein the nesting block has a plurality of apertures to accommodate a plurality of fasteners, and wherein the plurality of apertures are on different sides of the nesting block.

12. The customizable nest of claim 1, wherein the nesting block has a plurality of apertures to accommodate a plurality of fasteners.

13. The customizable nest of claim 12, wherein the plurality of apertures are on different sides of the nesting block.

14. A customizable nest for a device under test, comprising:
    a nest plate having a top surface and a bottom surface; and
    a plurality of nesting blocks for attachment through a plurality of different orientations of placement of the nesting blocks on the top surface of the nest plate, not restricted to predetermined locations on the top surface, in order to nest the device under test, the nesting blocks being attached using a removable fastening element,
    wherein each of the nesting blocks contains an aperture for accommodating a fastener to permanently attach the nesting blocks to the top surface of the nest plate.

15. The customizable nest of claim 14 wherein the removable fastening element includes double-stick tape.

16. The customizable nest of claim 14 wherein the nest plate and the nesting blocks are composed of a polymer material.

17. The customizable nest of claim 14 wherein the nesting blocks have a rectangular cross-sectional shape.

18. The customizable nest of claim 14 wherein the nest plate includes an aperture for access to a portion of the device under test when placed against the top surface.

\* \* \* \* \*